United States Patent
Shiue et al.

(10) Patent No.: US 8,048,696 B2
(45) Date of Patent: Nov. 1, 2011

(54) LIGHT EMITTING DIODE DEVICES AND MANUFACTURING METHOD THEREOF

(75) Inventors: Ching-Chuan Shiue, Taoyuan Hsien (TW); Shih-Peng Chen, Taoyuan Hsien (TW); Chao-Min Chen, Taoyuan Hsien (TW); Huang-Kun Chen, Taoyuan Hsien (TW)

(73) Assignee: Delta Electronics, Inc., Taoyuan Hsien (TW)

( * ) Notice: Subject to any disclaimer, the term of this patent is extended or adjusted under 35 U.S.C. 154(b) by 402 days.

(21) Appl. No.: 12/068,554

(22) Filed: Feb. 7, 2008

(65) Prior Publication Data
US 2009/0014738 A1    Jan. 15, 2009

(30) Foreign Application Priority Data
Jul. 10, 2007   (TW) ................. 96125039 A

(51) Int. Cl.
*H01L 21/00* (2006.01)

(52) U.S. Cl. ............ 438/28; 438/458; 438/459; 438/46; 257/E21.599; 257/E33.001

(58) Field of Classification Search ........... 438/34–35, 438/39–40, 460–465, 29, 42–43, 26, 28, 438/33, 38, 98, 99, 88, 91, 458, 459, 670; 257/E21.6–E21.61, E33.068, E33.075, E33.06, 257/E33.072–E33.073, E21.699, E21.7, E21.599, 257/E21.51, E25.021, E33.067, E21.697, 257/E21.54, E33.055, E33.056, E33.062, 257/E33.001
See application file for complete search history.

(56) References Cited

U.S. PATENT DOCUMENTS

| | | | |
|---|---|---|---|
| 6,423,560 B1 * | 7/2002 | Trezza et al. | 438/25 |
| 6,806,112 B1 * | 10/2004 | Horng et al. | 438/29 |
| 6,876,005 B2 | 4/2005 | Hsieh et al. | |
| 6,884,646 B1 * | 4/2005 | Wu et al. | 438/22 |
| 6,969,626 B2 | 11/2005 | Guo et al. | |
| 7,026,181 B2 | 4/2006 | Guo et al. | |
| 7,473,571 B2 * | 1/2009 | Hwang et al. | 438/46 |
| 7,488,613 B2 * | 2/2009 | Kunisato et al. | 438/47 |
| 7,563,629 B2 * | 7/2009 | Lee et al. | 438/34 |
| 7,572,652 B2 * | 8/2009 | Ikemoto et al. | 438/22 |
| 7,588,952 B2 * | 9/2009 | Lee et al. | 438/28 |
| 7,867,795 B2 * | 1/2011 | Shiue et al. | 438/28 |
| 2002/0055237 A1 * | 5/2002 | Sayyah | 438/458 |
| 2004/0079951 A1 * | 4/2004 | Horng et al. | 257/79 |
| 2006/0246687 A1 * | 11/2006 | Kaiser et al. | 438/458 |
| 2008/0283503 A1 * | 11/2008 | Liu et al. | 216/99 |
| 2008/0315220 A1 * | 12/2008 | Lee et al. | 257/94 |
| 2010/0159622 A1 * | 6/2010 | Hsieh et al. | 438/29 |

FOREIGN PATENT DOCUMENTS
TW    I224876    12/1992
TW    0543210 B    7/2003
* cited by examiner

*Primary Examiner* — Matthew Landau
*Assistant Examiner* — Latanya N Crawford
(74) *Attorney, Agent, or Firm* — Birch, Stewart, Kolasch & Birch, LLP

(57) ABSTRACT

A light emitting diode (LED) device includes a stacked epitaxial structure, a heat-conductive plate and a seed layer. The stacked epitaxial structure sequentially includes a first semiconductor layer (N—GaN), a light emitting layer, and a second semiconductor layer (P—GaN). The heat-conductive plate is disposed on the first semiconductor layer, and the seed layer is disposed between the first semiconductor layer and the heat-conductive plate. Also, the present invention discloses a manufacturing method thereof including the steps of: forming at least one temporary substrate, which is made by a curable polymer material, on an LED device, and forming at least a heat-conductive plate on the LED device.

15 Claims, 5 Drawing Sheets

000
LIGHT EMITTING DIODE DEVICES AND MANUFACTURING METHOD THEREOF

BACKGROUND OF THE INVENTION

1. Field of the Invention

The invention relates to a light emitting diode device and a manufacturing method thereof.

2. Description of the Related Art

A light emitting diode (LED) device is a semiconductor luminescent device, providing many advantageous features such as low power consumption, long lifetime, short response time, and so on. The sizes of LED devices are so small that they are easily manufactured to very small devices. Thus, with the continuous improvement of the technology recently, applications of LED devices have been applied in indicator lights of computers or home appliances, back light units of liquid crystal display device, traffic signals, or indicator lights of cars.

According to the prior art, in order to improve luminescence efficiency of LED devices, metal reflective substrates are disposed on LED devices reflecting light to improve luminescence efficiency. However, there are some problems with such LED devices which need to be solved.

FIG. 1 shows the LED device disclosed in Taiwan Patent No. 0544958. The LED device includes a metal reflective substrate 801 and a stacked structure on the metal reflective substrate 801. The stacked structure sequentially includes a first reaction layer 802, a transparent bonding layer 803, a second reaction layer 804, a transparent conductive layer 805, a first contact layer 806, a p-type epitaxial layer 807, a light emitting layer 808, an n-type epitaxial layer 809, and a second contact layer 810. In addition, an electrode 811 and an electrode 812 are disposed on the second contact layer 810 and the transparent conductive layer 805, respectively.

The LED device is formed by bonding the first reaction layer 802 with the second reaction layer 804 through the transparent bonding layer 803 and bonding the metal reflective substrate 801 with the first reaction layer 802. However, since the transparent bonding layer 803 is made of plastic materials, the heat generated from the LED device can not transfer to the metal reflective substrate 801 and dissipate effectively. As a result, the efficiency of the LED device dramatically decreases when the heat inside the LED device continuously accumulates.

Additionally, in the dicing process, a plurality of LED devices are obtained by dicing the metal reflective substrate 801 and the stacked structure. However, the metal particle produced in the dicing process can adhere to the sidewalls of the stacked structure and thus increase the leakage current of the stacked structure.

FIG. 2 shows the LED device disclosed in Taiwan Patent No. 0543210. The LED device is formed by bonding a light emitting diode stacked structure 902 with a metal reflective substrate 903 through a metal bonding layer 901. The bonding of the metal bonding layer 901 with the metal reflective substrate 903 requires a high temperature and high pressure, which, however causes inter-diffusion between the light emitting diode stacked structure 902 and the metal reflective substrate 903. In addition, the leakage current of the light emitting diode stacked structure 902 can increase due to the dicing process.

The two conventional LED devices above are both fabricated by forming the stacked epitaxial structure on an epitaxial substrate, then disposing the stacked epitaxial structure on a glass substrate or an electroplating substrate through a replacement process, and then dicing into individual LED devices. Thus, while an additional dicing process is needed for the method described, the probability of metal particles adhering to the sidewalls of the stacked structure is high.

BRIEF SUMMARY OF INVENTION

An object of the invention is to provide an LED device having an electric forged heat-conductive plate with low residual stress and heat corrosion resistance. The LED device can be formed without any dicing process, thus allowing costs and the leakage current to be reduced.

Thus, to achieve the above objective, the invention provides a light emitting diode device including a stacked epitaxial structure, a heat-conductive plate, and a seed layer. The stacked epitaxial structure includes a first semiconductor layer, a light emitting layer, and a second semiconductor layer. The heat-conductive plate is disposed with respect to the first semiconductor layer and the seed layer is disposed between the first semiconductor layer and the heat-conductive plate. Therein, the first semiconductor layer is an n-type epitaxial layer and the second semiconductor layer is a p-type epitaxial layer. For example, the first semiconductor layer is an N—GaN layer and the second semiconductor layer is a P—GaN layer.

The invention further provides a method for manufacturing a light emitting diode device, wherein the method includes: forming at least a temporary substrate on a light emitting diode device, and forming at least a heat-conductive plate on the light emitting diode device.

Therein, the temporary substrate is a curable polymer material. Because the finished LED device can be obtained by removing the temporary substrate after removing the epitaxial substrate by etching or laser ablation, dicing is not required and the probability of the metal particle adhering to the sidewalls of the stacked epitaxial structure can be reduced. In addition, the heat-conductive plate of the invention has low residual stress and heat corrosion resistance which can prevent the separation between the stacked epitaxial structure and the heat-conductive plate or the damage of the stacked epitaxial structure. The advantageous features of the invention include that product yield can be improved and costs can be reduced.

As mentioned above, the method for manufacturing a light emitting diode device according to the invention is featured by forming a temporary substrate on a light emitting diode device, and forming at least a heat-conductive plate on the light emitting diode device. Compared with prior art methods, the invention takes advantage of the characteristics of curable polymer material such as its removability, expandability, and ductility to separate the devices naturally to form a plurality of LED devices after easily removing the temporary substrate. Thus, the problem of leakage current generated from the dicing process can be prevented and thus reduce the costs of the dicing process and improve product yield.

BRIEF DESCRIPTION OF DRAWINGS

The invention can be more fully understood by reading the subsequent detailed description and examples with references made to the accompanying drawings, wherein.

DETAILED DESCRIPTION OF INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
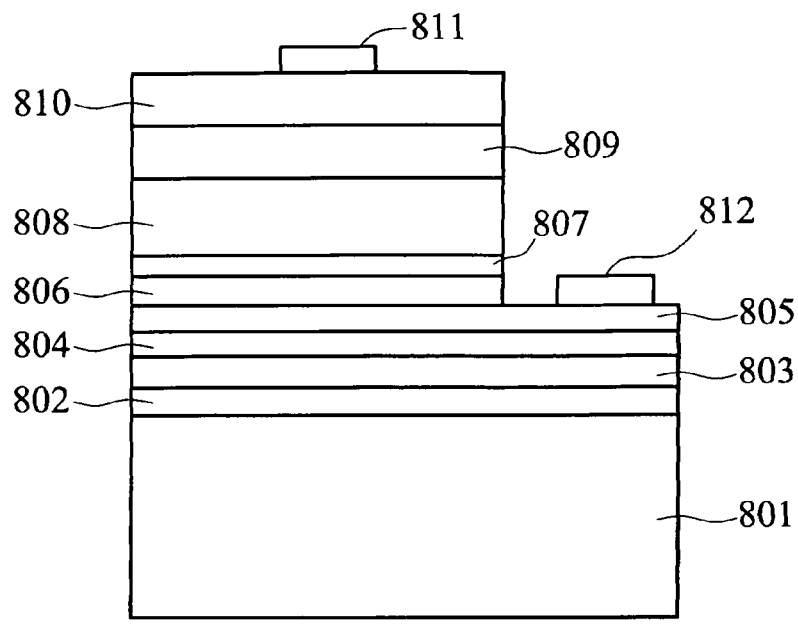
FIG. 1 is a cross-sectional view of a conventional LED device.
Figure 2:
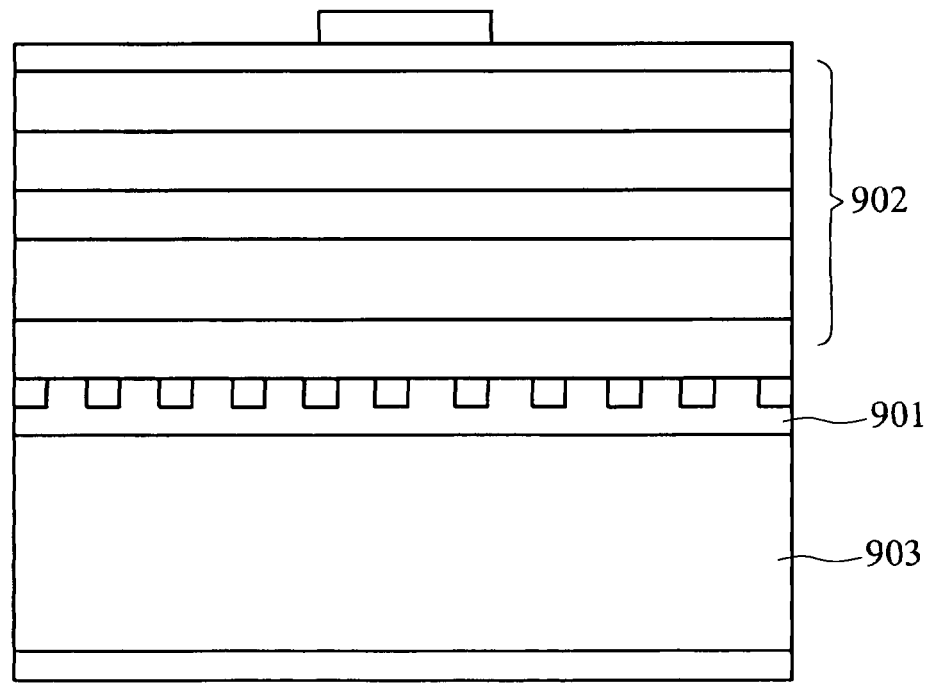
FIG. 2 is a cross-sectional view of another conventional LED device.
Figure 3:
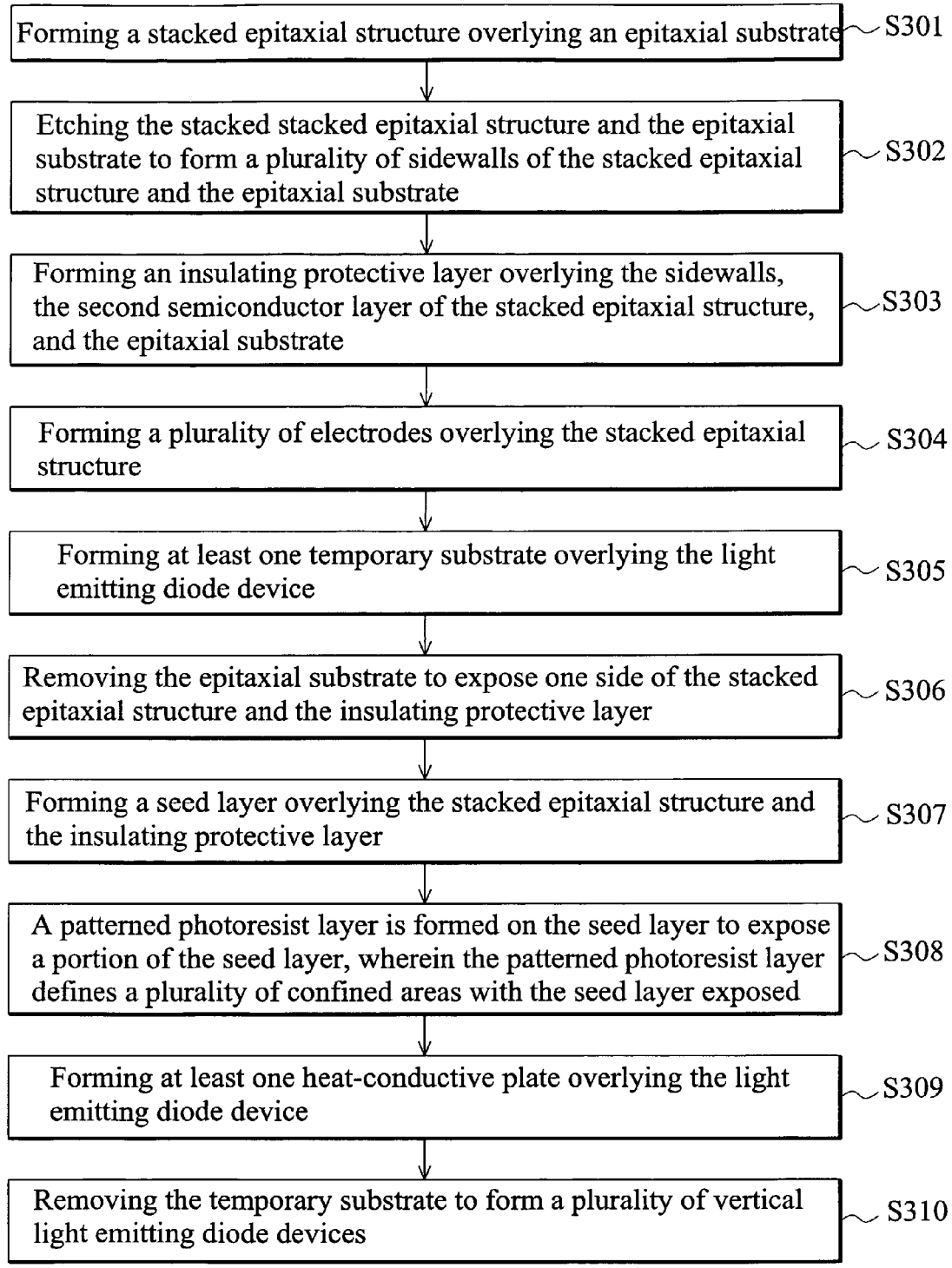
FIG. 3 is a flow chart showing the manufacturing steps of the LED device according to a preferred embodiment of the invention.

FIG. 3 is a flow chart showing the manufacturing steps of the LED device according to a preferred embodiment of the invention, wherein the flow chart includes step S301 to step S310. Hereinafter, please also refer to FIG. 4A to FIG. 4H.

Figure 4A:
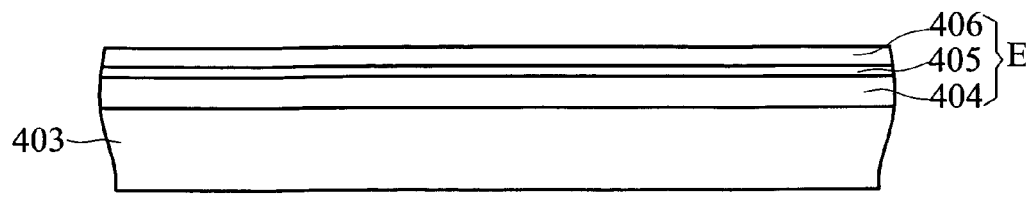
FIG. 4A to FIG. 4H are cross-sectional views showing the steps for fabricating LED devices according to the preferred embodiment of the invention.

As shown in FIG. 4A, a stacked epitaxial structure on an epitaxial substrate 403 is formed, wherein the stacked epitaxial structure E sequentially includes a first semiconductor layer 404, a light emitting layer 405, and a second semiconductor layer 406 (step S301). The first semiconductor layer 404 is formed on the epitaxial substrate 403, then the light emitting layer 405 is formed on the first semiconductor layer 404, and then the second semiconductor layer 406 is formed on the light emitting layer 405.

In the embodiment, the first semiconductor layer 404 and the second semiconductor layer 405 are an n-type epitaxial layer and a p-type epitaxial layer, respectively. However, the type of the first and the second semiconductor layers can be exchanged.

Figure 4B:
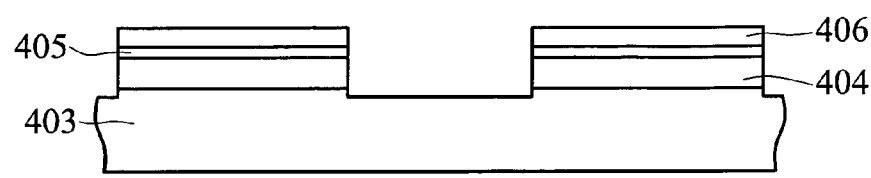
Figure 4C:
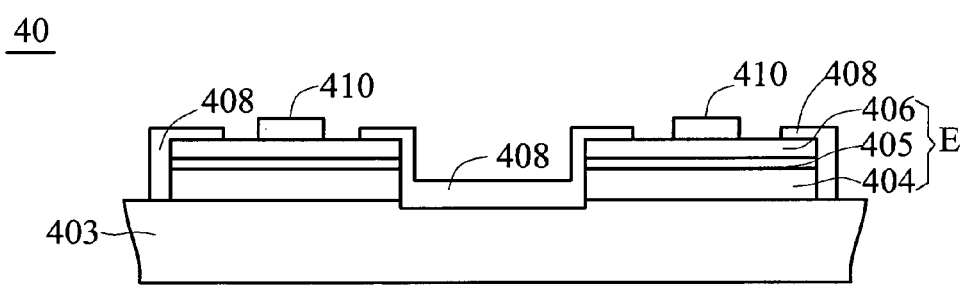

As shown in FIG. 4B, a portion of the stacked epitaxial structure E are etched to the epitaxial substrate 403 to form a plurality of sidewalls of stacked epitaxial structure E and to expose a portion of the epitaxial substrate 403 (step S302). In this step, the sidewalls can be formed by a photolithography process and an etching process, such as photoresist coating, exposing, development, etching, photoresist removing, and so on. The etching process can be carried out by a dry etching or a wet etching. As shown in FIG. 4C, after the etching process, an insulating protective layer 408 is formed on a portion of the second semiconductor layer 406 of the stacked epitaxial structure E, the sidewalls of the stacked epitaxial structure E, and the exposed epitaxial substrate 403 (step S303). The material of the insulating protective layer 408 is an insulating dielectric material such as oxide, nitride, or silicon carbide and so on.

Then, a plurality of electrodes 410 are formed on the epitaxial structure (step S304). The electrodes 410 are disposed on the second semiconductor layer 406 to form an LED device 40. Because the electrodes are defined first in this step instead of forming the electrodes after adhering the structure to a temporary substrate, product yield is efficiently improved and manufacturing is simplified.

Figure 4D:
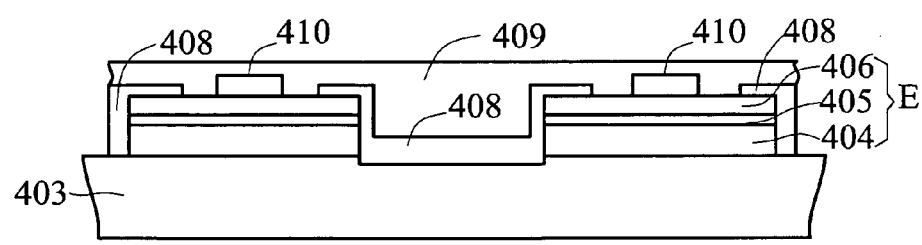

As shown in FIG. 4D, after forming the electrodes 413, a temporary substrate 409 is formed on the LED device 40 (step S305), and the temporary substrate 409 covers the electrodes 410. The temporary substrate 409 can be directly formed by a curable polymer material such as glass, thick film photoresist, or fluorinated rubber and so on. When curable polymer material is used as the material of the temporary substrate 409, the forming process of the temporary substrate 409 can include forming a curable polymer material on the light emitting diode device, and curing the curable polymer material. The curable polymer material can be formed on the light emitting diode device by spin coating, screen printing, or gel dispensing and so on. The curable polymer material can be cured by photo curing, thermal curing, or cool curing. In addition, the curable polymer material can be used as a bonding layer to bond a substrate, and thus the temporary substrate 409 is directly formed by the substrate and the curable polymer material.

Figure 4E:
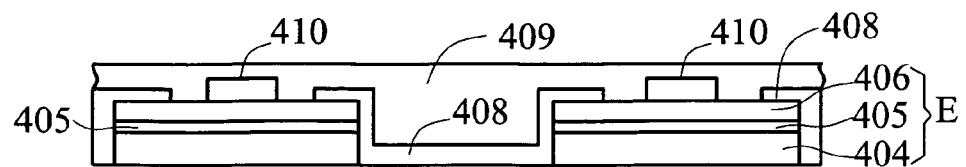

As shown in FIG. 4E, after forming the temporary substrate 409, the epitaxial substrate 403 is removed to expose a bottom surface of the stacked epitaxial structure E and a portion of the insulating protective layer 408, wherein the epitaxial substrate 403 can be removed by laser ablation, polishing, or etching and so on (step S306).

Figure 4F:
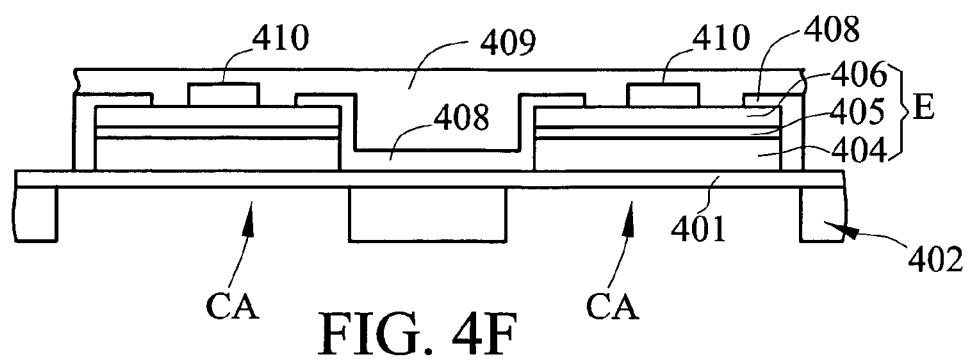

As shown in FIG. 4F, after removing the epitaxial substrate 403, a seed layer 401 is formed on the bottom surface of the stacked epitaxial structure E, wherein the seed layer 401 includes a reflective layer, an ohmic contact layer, and a metal bonding layer (step S307). The material of the reflective layer can be either a dielectric material or a metal. The metal can include Al, Ni, Ti, Pt, Au, Ag, Cr/Al, Ni/Al, Pd, Ti/Al, Ti/Ag, Cr/Pt/Au or any combination thereof. The material of the ohmic contact layer can include Ni/Au, ITO (indium tin oxide), IZO (indium zinc oxide), or AZO (aluminum doped zinc oxide). In another embodiment of the invention, the seed layer 401 can be formed of a single layer, i.e. an ohmic contact layer with a function of reflective metal layer. The material of the ohmic contact-reflective metal layer can include Al, Ni, Ti, Ge, Cr, Pt, Au, Ag, Ni/Cr, Cr/Au, Ni/Ag, Pd, Ti/Au, Ti/Ag, Cr/Pt/Au, Ti/Al/Ti/Au, Au/Ge/Ni, Ti/Pt/Au, Ti/Al/Pt/Au or any combination thereof.

A patterned photoresist layer 402 is formed on the seed layer 401 to expose a portion of the seed layer 401, wherein the patterned photoresist layer 402 defines a plurality of confined areas CA with the seed layer 401 exposed (step S308).

Figure 4G:
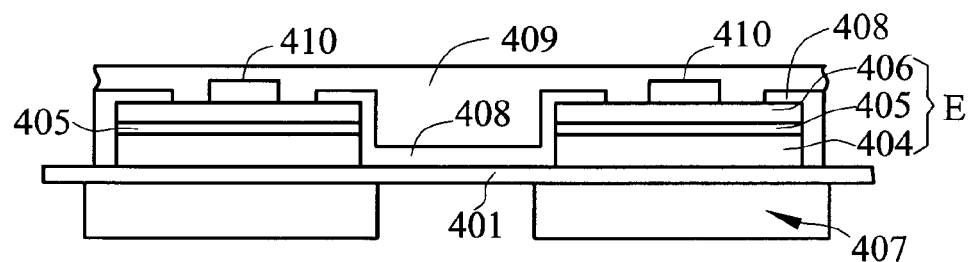
Figure 5A:
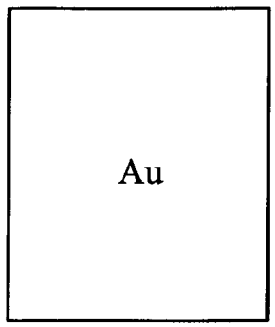
FIG. 5A to FIG. 5D are cross-sectional views of various heat-conductive plates shown in FIG. 4H.
Figure 5B:
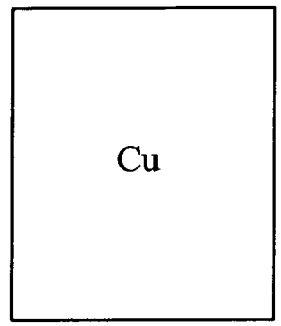
Figure 5C:
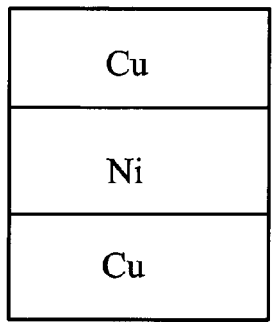
Figure 5D:
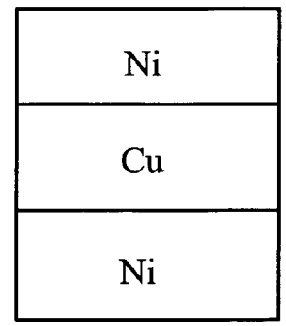

Then, as shown in FIG. 4G, at least a heat-conductive plate 407 is formed on the LED device 40 (step S309). The heat-conductive plate 407 can be formed on the seed layer 401 by electrochemical deposition, electric forging, or electroplating. The location of the heat-conductive plate 407 is defined by the confined areas CA of the patterned photoresist layer 402. The material of the heat-conductive plate can include at least a heat-conductive metal such as Ni, Cu, Co, Au, or Al and so on. It should be appreciated that the heat-conductive plate 407 can be formed by a single material such as Au (as shown in FIG. 5A) or Cu (as shown in FIG. 5B) or a plurality of heat-conductive metals with multilayer structure such as Cu—Ni—Cu (a shown in FIG. 5C) or Ni—Cu—Ni (as shown in FIG. 5D) and so on. However, the material of the heat-conductive plate is not limited to the materials mentioned above, any material which can achieve good heat conductivity can be applied in the embodiment of the invention.

Figure 4H:
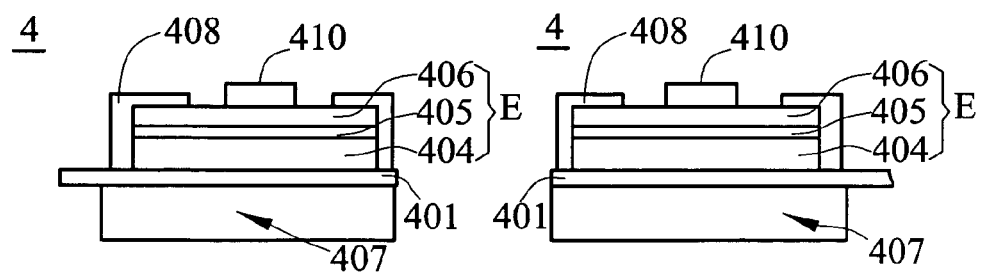

As shown in FIG. 4H, the temporary substrate 409 is removed to form a plurality of vertical LED devices 4 (step S310). The temporary substrate 409 can be removed easily by laser ablation, polishing, etching, heating, or organic solvent due to the characteristics of the curable polymer material used such as its removability, expandability, and ductility. While the temporary substrate is removed, a portion of the insulating protective layer 408 and the seed layer 401 are also removed. Thus, the device separates automatically to form a plurality of LED devices 4.

In the embodiment, the heat-conductive plate is formed on the first semiconductor layer 404. Because the resistance of the n-type epitaxial layer (N—GaN) is lower, it is not necessary to use a transparent conductive layer in the structure of the seed layer 401 between the first semiconductor layer 404 and the heat-conductive plate 407 to achieve good current diffusion.

Moreover, because a dicing process to the heat-conductive plate 407 to obtain the LED devices in the embodiment of the invention is not required, the problem of leakage current generated from the dicing process can be prevented. In addition, the insulating protective layer 408 disposed on the sidewalls of the stacked epitaxial structure E also has an electric isolation function and can assist in reducing leakage current.

What should be noted here specially is that the steps are not limited to the sequence mentioned above. The sequence of each step can be exchanged according to manufacturing process requirements.

As described above, the manufacturing method for an LED device according to the embodiment of the invention uses a curable polymer material to directly form a temporary substrate on an LED device, and forms at least a heat-conductive plate on the LED device. Compared with prior art methods, the invention not only reduces the step of using a bonding layer to adhere the semiconductor structure to another substrate but also naturally separates the device into a plurality of LED devices after easily removing the temporary substrate due to the characteristics of the curable polymer material used such as its removability, expandability, ductility and so on. Thus, the problem of leakage current generated from the dicing process can be prevented. Further, the costs of the dicing process can be saved and product yield can be improved.

Moreover, the heat-conductive plate in the embodiment of the invention is formed by electroplating, electric forging, electroforming or electrochemical deposition and so on. Thus, the problems in the prior art such as low heat conductivity of the transparent bonding layer made of a plastic material or diffusion inside the LED device caused by the manufacturing process with high temperature and high pressure can be prevented, thus, improving the heat conductivity and the product yield. In addition, the heat-conductive plate of the invention has low residual stress and heat corrosion resistance which can prevent the separation between the stacked epitaxial structure and the heat-conductive plate or the damage of the stacked epitaxial structure, thus, increasing product yield and decreasing manufacturing costs. Moreover, the presence of the insulating protective layer can further reduce leakage current.

While the invention has been described by way of example and in terms of preferred embodiment, it is to be understood that the invention is not limited thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A method for manufacturing a light emitting diode device, comprising:
   forming a stacked epitaxial structure on an epitaxial substrate;
   removing a portion of the stacked epitaxial structure and a portion of the epitaxial substrate to form at least a hole extending into the epitaxial substrate, wherein the hole exposes a plurality of sidewalls of the stacked epitaxial structure and a portion of the epitaxial substrate;
   forming an insulating protective layer on the sidewalls of the stacked epitaxial structure and the portion of the epitaxial substrate exposed;
   forming at least a temporary substrate overlying the stacked epitaxial structure, the insulating protective layer, and the sidewalls of the stacked epitaxial structure for supporting the stacked epitaxial structure with the sidewalls;
   removing the epitaxial substrate to expose a bottom surface of the stacked epitaxial structure and a portion of the insulating protective layer;
   forming at least a heat-conductive plate beneath the stacked epitaxial structure; and
   removing the temporary substrate to automatically separate the stacked epitaxial structure into a plurality of LED devices.

2. The method for manufacturing a light emitting diode device as claimed in claim 1, wherein the heat-conductive plate is formed by electrochemical deposition, electric forging, or electroplating.

3. The method for manufacturing a light emitting diode device as claimed in claim 1, wherein the temporary substrate comprises a curable polymer material, a glass, a thick film photoresist, or a fluorinated rubber.

4. The method for manufacturing a light emitting diode device as claimed in claim 1, wherein the step of forming the temporary substrate comprises:
   forming a curable polymer material; and
   curing the curable polymer material.

5. The method for manufacturing a light emitting diode device as claimed in claim 1, wherein the stacked epitaxial structure sequentially comprises a first semiconductor layer, a light emitting layer, and a second semiconductor layer on the epitaxial substrate, and the first semiconductor layer and the second semiconductor layer are an n-type epitaxial layer and a p-type epitaxial layer, respectively, or are a p-type epitaxial layer and an n-type epitaxial layer, respectively.

6. The method for manufacturing a light emitting diode device as claimed in claim 1, wherein a material of the insulating protective layer is an insulating dielectric material, oxide, nitride, or silicon carbide.

7. The method for manufacturing a light emitting diode device as claimed in claim 1, wherein after the forming of the insulating protective layer, the method further comprises:
   forming a plurality of electrodes on the stacked epitaxial structure, wherein the temporary substrate covers the electrodes and the insulating protective layer; and
   removing the epitaxial substrate to expose one side of the stacked epitaxial structure and a portion of the insulating protective layer.

8. The method for manufacturing a light emitting diode device as claimed in claim 1, wherein the temporary substrate is removed by laser ablation, polishing, etching, heating, or organic solvent.

9. The method for manufacturing a light emitting diode device as claimed in claim 4, wherein the curable polymer material is formed by spin-coating, screen printing, or gel dispensing, and cured by photo curing, thermal curing, or cool curing.

10. The method for manufacturing a light emitting diode device as claimed in claim 7, wherein the epitaxial substrate is removed by laser ablation, polishing, or etching.

11. The method for manufacturing a light emitting diode device as claimed in claim 7, wherein after the removing of the epitaxial substrate, the method further comprises:
   forming a seed layer on the side of the stacked epitaxial structure and the portion of the insulating protective layer; and
   forming a patterned photoresist layer on the seed layer, wherein the patterned photoresist layer defines a plurality of confined areas for allowing the heat-conductive plate to be formed thereon.

12. The method for manufacturing a light emitting diode device as claimed in claim 11, wherein the seed layer comprises a reflective layer, an ohmic contact layer, and a metal bonding layer.

13. The method for manufacturing a light emitting diode device as claimed in claim 11, wherein the seed layer is an ohmic contact layer with a function of a reflective metal layer.

14. The method for manufacturing a light emitting diode device as claimed in claim 12, wherein the material of the reflective layer comprises Ti, Ni, Al, Pt, Au, Ag, Cr/Al, Ni/Al, Pd, Ti/Al, Ti/Ag, Cr/Pt/Au or any combination thereof, and the material of the ohmic contact layer comprises Ni/Au, ITO, IZO, or AZO.

15. The method for manufacturing a light emitting diode device as claimed in claim 13, wherein the material of the seed layer comprises Al, Ni, Ti, Ge, Cr, Pt, Au, Ag, Ni/Cr, Cr/Au, Ni/Ag, Pd, Ti/Au, Ti/Ag, Cr/Pt/Au, Ti/Al/Ti/Au, Au/Ge/Ni, Ti/Pt/Au, Ti/Al/Pt/Au or any combination thereof.

* * * * *